(12) United States Patent
Shimoida et al.

(10) Patent No.: US 7,521,731 B2
(45) Date of Patent: Apr. 21, 2009

(54) SEMICONDUCTOR DEVICE AND METHOD OF MANUFACTURING THE SAME

(75) Inventors: Yoshio Shimoida, Yokosuka (JP);
Masakatsu Hoshi, Yokohama (JP);
Tetsuya Hayashi, Yokosuka (JP);
Hideaki Tanaka, Yokohama (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 327 days.

(21) Appl. No.: 11/444,433

(22) Filed: Jun. 1, 2006

(65) Prior Publication Data
US 2006/0220061 A1 Oct. 5, 2006

(51) Int. Cl.
*H01L 31/0328* (2006.01)
(52) U.S. Cl. .................. 257/183; 257/192; 438/105
(58) Field of Classification Search .............. 257/77, 257/330; 438/105
See application file for complete search history.

(56) References Cited

U.S. PATENT DOCUMENTS

| 5,216,275 | A | 6/1993 | Chen |
| 5,753,938 | A * | 5/1998 | Thapar et al. ............ 257/77 |
| 6,274,904 | B1 | 8/2001 | Tihanyi |
| 6,573,534 | B1 * | 6/2003 | Kumar et al. ............ 257/77 |
| 7,049,658 | B2 | 5/2006 | Saito et al. |
| 7,294,886 | B2 | 11/2007 | Saito et al. |
| 2004/0166619 | A1 * | 8/2004 | Takemori et al. ......... 438/197 |
| 2005/0062048 | A1 * | 3/2005 | Hayashi et al. ........... 257/77 |
| 2007/0069324 | A1 | 3/2007 | Takaishi |

FOREIGN PATENT DOCUMENTS

| CN | 1518123 A | 8/2004 |
| DE | 198 39 970 A1 | 3/2000 |
| EP | 1 139 433 A1 | 10/2001 |
| EP | 1 544 920 A2 | 6/2005 |
| JP | 2003-318398 A | 11/2003 |
| WO | WO 2005/064684 A1 | 7/2005 |

OTHER PUBLICATIONS

W. Saito et al., "A 20mΩcm² 600 V-class Superjunction MOSFET," Proceedings of the 16th International Symposium on Power Semiconductor Devices & ICs, May 24-27, 2004, pp. 459-462.
A. T. Hajjiah et al., "Novel SiC-Trench-MOSFET with Reduced Oxide Electric Field," Proceedings of Solid-State and Integrated Circuits Technology, Oct. 18, 2004, pp. 340-344.

* cited by examiner

*Primary Examiner*—N Drew Richards
*Assistant Examiner*—Mamadou Diallo
(74) *Attorney, Agent, or Firm*—Foley & Lardner LLP

(57) ABSTRACT

A semiconductor device of the invention includes a first conductive type semiconductor base substrate; and a switching mechanism which is formed on a first main surface of the semiconductor base substrate and switches ON/OFF of a current. In the semiconductor base substrate, a plurality of columnar hetero-semiconductor regions are formed at spaced intervals within the semiconductor substrate, and the heterosemiconductor regions are made of a semiconductor material having a different band gap from the semiconductor substrate and extend between the first main surface and a second main surface opposite to the first main surface.

4 Claims, 2 Drawing Sheets

SEMICONDUCTOR DEVICE AND METHOD OF MANUFACTURING THE SAME

BACKGROUND OF THE INVENTION

The present invention relates to a semiconductor device and a method of manufacturing the same.

Earlier techniques include a so-called superjunction (SJ) power MOSFET (metal oxide semiconductor field effect transistor) described in "Proceedings of 2004 International Symposium Power Semiconductor Devices & ICs, Kitakyushu, p. 459-462," for example.

The SJ-MOSFET can exceed a limit of theoretical performance determined by an Si (silicon) material, although Si is used as the material of the SJ-MOSFET. Moreover, in the SJ-MOSFET, p and n impurity regions are formed in a sandwich arrangement in a drift region of a body portion. In this structure, a depletion layer is extended in a horizontal direction, and thereby it is possible to simultaneously deplete the whole drift region, which has not been possible with earlier structures. Therefore, the structure can achieve a higher impurity concentration in a p-type region and lower on-resistance as compared to the earlier structures.

SUMMARY OF THE INVENTION

Because of needs of p-type and n-type columnar structures, the above-mentioned SJ structure has needed to form the p-type columnar structure on an n-type semiconductor substrate having a depth depending on an element breakdown voltage.

Thus, formation of an element includes: a process of multistage epitaxial growth, and a process of impurity introduction on a patterned region after the epitaxial growth process. The processes are repeated multiple times to form the element. Thus, the SJ structure had a problem of rising costs.

An object of the invention is to provide a semiconductor device capable of realizing a switching element having low on-resistance at a low cost, and a method of manufacturing a semiconductor device.

In order to solve the foregoing problem, a semiconductor device of the invention includes a first conductive type semiconductor base substrate; and a switching mechanism which is formed on a first main surface of the semiconductor base substrate and switches ON/OFF of a current. In the semiconductor base substrate, a plurality of columnar hetero-semiconductor regions are formed at spaced intervals within the semiconductor substrate, and the hetero-semiconductor regions are made of a semiconductor material having a different band gap from the semiconductor substrate and extend between the first main surface and a second main surface opposite to the first main surface.

DETAILED DESCRIPTION OF THE PREFERRED EMBODIMENTS

Figure 1:
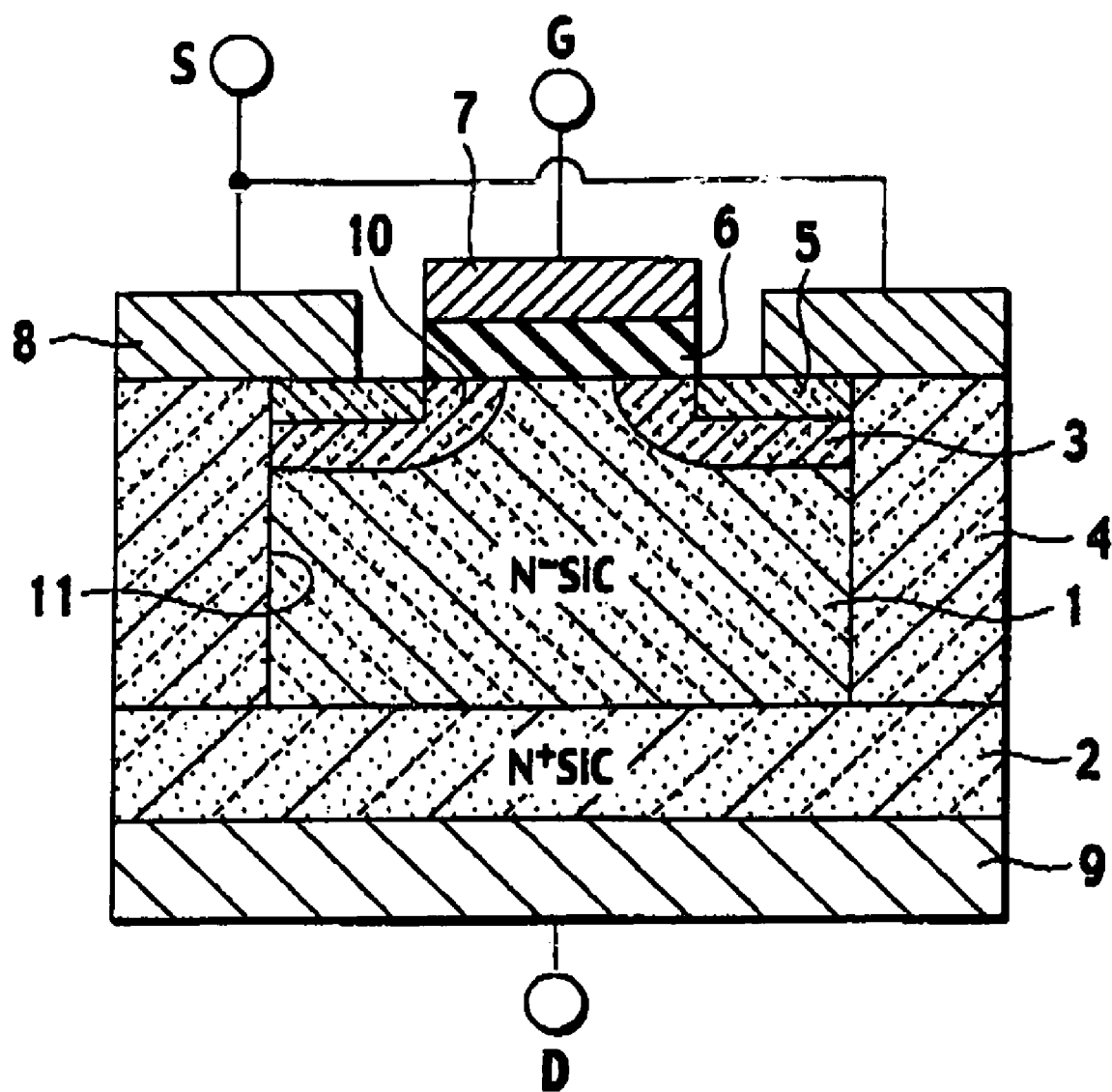
FIG. 1 is a sectional view showing a structure of an element portion of a semiconductor device according to a first embodiment of the present invention.

Embodiments of the present invention will be described in detail below with reference to the drawings. In the drawings to be described below, the same reference numerals designate parts having the same functions, and the repeated description of these parts will be omitted.

First Embodiment (Configuration)

A first embodiment of the invention will be described with reference to FIG. 1. FIG. 1 is a sectional view showing a structure of an element portion of a semiconductor device according to the first embodiment of the present invention.

A configuration shown in FIG. 1 will be explained. A drain region 1 made of n-type SiC (silicon carbide) epitaxially grown is formed on an n$^+$ type SiC substrate 2. A power MOSFET is formed on a first main surface of the n-type SiC drain region 1. A polytype of the SiC can be 4H, 6H, 3C, or others. Moreover, the SiC may be replaced by GaN (gallium nitride) or diamond, which is a wide band gap material excellent for use in a power device.

The power MOSFET used as a switching mechanism may be replaced by a switching mechanism of other switching devices. For example, a JFET (unction FET), a MESFET (metal-semiconductor FET), a bipolar transistor, or a switching mechanism utilizing a heterojunction, which is disclosed in Japanese Patent Laid-open Official Gazette No. 2003-318398 may be used. In a case of the power MOSFET, for example, utilizing an edge of a gate electrode 7, which is formed with a gate insulating film 6 interposed in between, a p-type well region 3 and an n$^+$ type source region 5 are formed by double diffusion. A channel region 10 is formed, on a surface of the p-type well region 3, in contact with the n$^+$ type source region 5, and immediately under the gate electrode 7. This switching mechanism controls an electric potential to be applied to the gate electrode 7, and thereby ON/OFF of a current between a drain electrode 9 and a source electrode 8 is switched. In other words, the switching mechanism in the case of the power MOSFET refers to the gate electrode 7, the gate insulating film 6, and the channel region 10. In a case of the JFET, p-type well regions are formed with an n-type source region interposed therebetween. The p-type well region has a low concentration and a relatively great depth, and the n-type source-region has a high concentration and a relatively shallow depth. The p-type well region constitutes a gate region, and a gate electrode is formed thereon. A region interposed in between the p-type well regions having a great depth constitutes a channel region. This switching mechanism controls an amount of injection of majority carriers from the n-type source region, by changing a height of a potential barrier across the channel region through application of gate and drain voltages. In other words, the switching mechanism in the case of the JFET refers to the gate electrode and the channel region. In the switching mechanism utilizing a heterojunction, a gate electrode is provided close to a heterojunction interface with a gate insulating film interposed therebetween. This switching mechanism controls a width of an energy barrier due to the heterojunction by controlling an electric potential to be applied to the gate electrode, and switches ON/OFF of a current by flowing a tunnel current.

When GaN is used, a channel structure utilizing a two-dimensional electron gas cloud may be used.

As for the explanation of the power MOSFET, the $n^+$ type source region 5 is formed within the p-type well region 3. The gate electrode 7 is formed on the gate insulating film 6 which is formed on the first main surface so as to lay on a plurality of (in FIG. 1, there are shown two p-type well regions 3) p-type well regions 3 arranged discretely. The source electrode 8 made of, for example, a metal is formed so as to connect to the $n^+$ type source region 5. FIG. 1 shows a representative example of an aspect in which two base unit cells face each other. A large number of cells, however, are actually connected in parallel. A concentration and a thickness of the drain region 1 are set according to a required breakdown voltage. The drain region 1 needs to have a thickness of about 10 µm as an example in order to obtain a breakdown voltage of 1000 V level. The $n^+$ type SiC substrate 2 is connected ohmically with the drain electrode 9 on its rear surface.

The configuration of the first embodiment is characterized in that a hetero-semiconductor region 4 made of $p^+$ type polysilicon (polycrystalline silicon) is formed in a columnar shape in the drain region 1. The hetero-semiconductor region 4 made of the $p^+$ type polysilicon is connected to the source electrode 8 made of, for example, a metal. The hetero-semiconductor region 4 is at the same potential as the source electrode 8, the $n^+$ type source region 5, and the p-type well region 3.

(Manufacturing Method)

Next, a method of manufacturing the semiconductor device mentioned above will be described. Since a detailed method of manufacturing the power MOSFET portion is generally known, therefore the description of this portion will be omitted. The description will be given only with regard to a method of manufacturing an essential configuration of the present invention. The $n^-$ type drain region 1 is formed on the $n^+$ type SiC substrate 2 by epitaxial growth. A trench 11 is formed in the surface of the drain region 1 by trench etching. A $p^+$ type polysilicon layer is deposited so as to fill in the trench 11. After the completion of the deposition of the $p^+$ type polysilicon layer in the trench 11, the $p^+$ type polysilicon layer deposited on the surface of the drain region 1 is removed by etch back or the like. Incidentally, introduction of $p^+$ type impurities to the polysilicon layer can be performed simultaneously with or after the deposition of the polysilicon layer. As described above, the method of manufacturing a semiconductor device according to the first embodiment includes an operation of forming a plurality of columnar trenches 11 in the first main surface of the semiconductor base substrate; and an operation of forming the hetero-semiconductor region 4 by filling each of the trenches 11 with a semiconductor material (e.g., $p^+$ type polysilicon) for forming the hetero-semiconductor region 4. The adoption of the above-mentioned manufacturing method facilitates a manufacturing process, and can prevent a rise in a manufacturing cost. Moreover, impurity implantation performed for each multistage epitaxial growth is not necessary. Thus, the above-mentioned manufacturing method can prevent variations in device characteristics and improve yields. Therefore, the manufacturing cost can be reduced.

(Operation)

The description will now be given with regard to an operation of the semiconductor device according to the first embodiment. The switching mechanism portion formed of the power MOSFET acts to switch ON/OFF of a main current passing through an element. In an operation of an original vertical power MOSFET, when the element turns on, a main current flows from the drain electrode 9 to the source electrode 8 through the $n^+$ type SiC substrate 2, the $n^-$ type drain region 1, the channel region 10 formed immediately under the gate insulating film 6, and the $n^+$ type source region 5. When the element turns off, a reverse bias is applied to a heterojunction formed between the hetero-semiconductor region 4 and the $n^-$ type drain region 1. In this case, the hetero-semiconductor region 4 is made of $p^+$ type polysilicon and is at the same potential as the source electrode 8. The heterojunction serves as a diode having a high breakdown voltage. By experimental results obtained by inventors' tremendous effort, it has been found out that the $p^+$ type is desirable to obtain diode characteristics which have a high breakdown voltage and produce little leakage current.

As described above, the semiconductor device according to the first embodiment includes the $n^+$ type SiC substrate 2 and the $n^-$ type drain region 1 which constitute a first conductive type semiconductor base substrate; and the switching mechanism, which is formed on the first main surface of the semiconductor base substrate (e.g., the $n^-$ type drain region 1) and switches ON/OFF of a current. In the semiconductor device, a plurality of columnar hetero-semiconductor regions 4, which extend between the first main surface and a second main surface opposite to the first main surface, are formed at spaced intervals within the semiconductor base substrate (e.g., the $n^-$ type drain region 1). The hetero-semiconductor regions 4 are made of a semiconductor material (e.g., $p^+$ type polysilicon) having a different band gap from the semiconductor base substrate (e.g., the $n^-$ type drain region 1).

Figure 3:
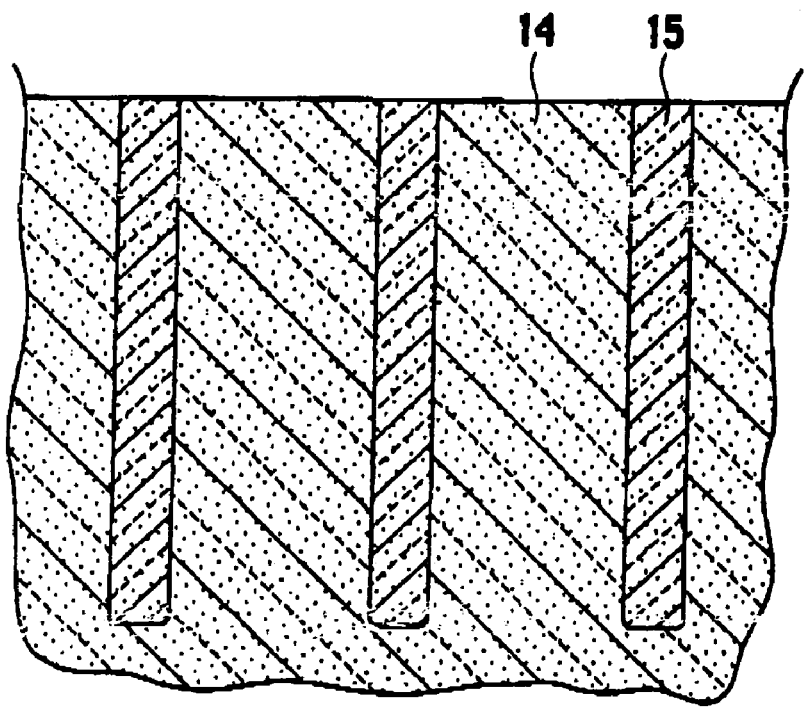
FIG. 3 is a sectional view showing a general structure of a heterojunction of the present invention.

By adopting the configuration of the first embodiment, a depletion layer can be extended in a horizontal direction in the drain region 1 when the element turns off. Therefore, the entire area of the drain region 1 is depleted, and a peak of electric field strength near an interface between the p-type well region 3 and the drain region 1 is reduced. Accordingly, it is possible to impart a uniform distribution of electric field in a vertical direction. Since the peak of electric field strength is reduced, a breakdown voltage can be increased. Thereby, a concentration of the drain region 1 can be increased to reduce on-resistance. Therefore, the first embodiment can achieve both a high breakdown voltage and low on-resistance which exceed material limits (i.e., theoretical performance limits) of a wide band gap semiconductor such as SiC. The earlier technology previously mentioned has a problem as given below. In the p-type and the n-type columnar structures, a depletion layer is extended in a horizontal direction in a state where a reverse bias is applied to the element, and thereby it is necessary to ensure a sufficient horizontal dimension. Therefore, there has been a problem of an increase in the horizontal dimension of the overall element. In the element of the first embodiment, no depletion layer spreads in the hetero-semiconductor region 4 made of $p^+$ type polysilicon, and thereby the p-type columnar structure can be formed as a narrow region, Therefore, the element of the first embodiment can be formed in a smaller horizontal dimension as compared to the SJ devices of earlier technology. As previously mentioned, the p-type columnar structure, which is formed between the n-type columnar structures (n-type drift regions) of the above-mentioned SJ device of earlier technology, has to introduce impurities for each multistage epitaxial growth. Thus, the SJ device of earlier technology inevitably has a great horizontal width in view of accuracy of alignment with patterning. On the other hand, in the first embodiment, hetero-semiconductor regions 15 made of $p^+$ type polysilicon corresponding to the p-type columnar structures can be formed as narrow regions at a time by trench etching, as illustrated in FIG. 3 showing the general configuration of the first embodiment, Thus, the p-type columnar structure can be greatly thinned (narrowed), although the horizontal width of an n-type columnar structure 14 (the drain region shown in FIG. 1) is about the same as those of the structures of earlier technology. A cell density of the overall element can be increased. The increase of the cell density permits a corresponding reduction in the on-resistance normalized according to the area of the element in the entire element. As mentioned above, the first embodiment enables a size reduction of the region for holding the breakdown voltage of the element, and thus achieves an effect of reducing sufficiently the on-resistance normalized according to the area of the element. Moreover, the first embodiment has an effect of achieving good breakdown voltage characteristics with little reverse leakage characteristics. By the above-described effectiveness, the semiconductor device according to the first embodiment can contribute greatly to size and cost reductions of a power electronics system such as an inverter for motor drive.

The semiconductor base substrate is made of any of silicon carbide (SiC) (employed herein), gallium nitride (GaN), or diamond. The hetero-semiconductor region 4 is made of at least one of monocrystalline silicon (silicon (Si)), polycrystalline silicon (employed herein), and amorphous silicon. Thus, a general semiconductor material can be used to easily form the semiconductor device having a high breakdown voltage.

The semiconductor device further includes the source electrode 8 formed on the first main surface of the semiconductor base substrate; and the drain electrode 9 formed on and connected ohmically with the second or the first main surface of the semiconductor base substrate (e.g., the second main surface because of the vertical device employed herein). In the semiconductor device, the switching mechanism switches ON/OFF of a current between the drain electrode 9 and the source electrode 8, and the hetero-semiconductor region 4 is electrically connected to the source electrode 8. This allows realizing the power MOSFET, which constitutes the switching element having low on-resistance, at a low cost.

The hetero-semiconductor region 4 is a second conductive type having a high concentration (e.g., the p type employed herein) with respect to the semiconductor base substrate. This allows realizing the switching element having low on-state resistance, at low cost.

Second Embodiment

Figure 2:
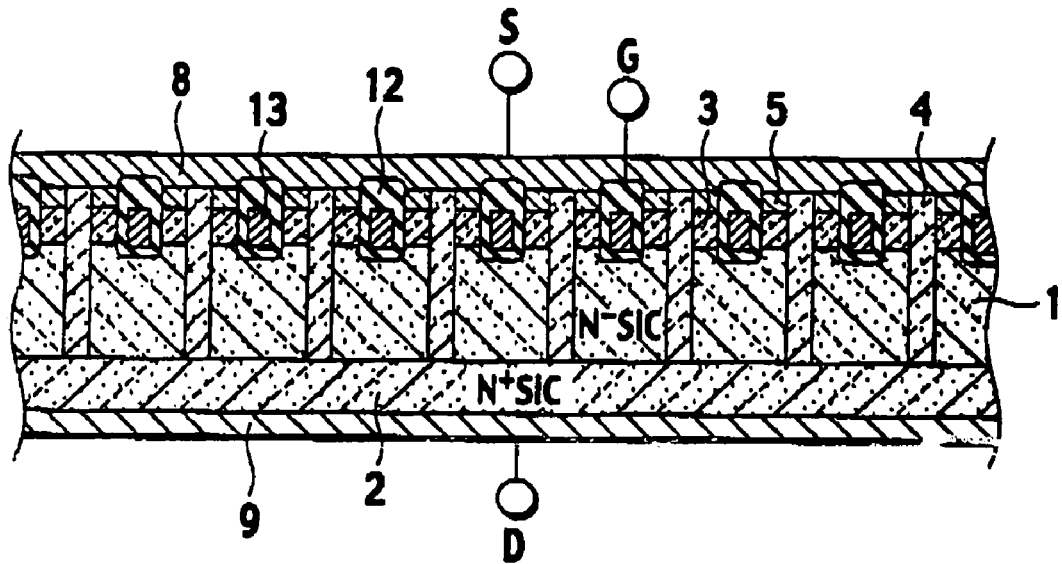
FIG. 2 is a sectional view showing a structure of an element portion of a semiconductor device according to a second embodiment of the present invention.

A second embodiment of the present invention will be described with reference to FIG. 2. FIG. 2 is a sectional view showing a structure of an element portion of a semiconductor device according to the second embodiment of the present invention.

In the second embodiment, the switching mechanism is applied to a U-gate (trench gate) power MOSFET. In FIG. 2, reference numerals 12 and 13 denote a gate insulating film and a U-gate electrode, respectively.

The first embodiment has been described by referring to the sectional structure in which two base cells face each other. In FIG. 2 showing the second embodiment, there is illustrated a wide range of the sectional structure in a way that a plurality of columnar hetero-semiconductor regions 4 made of p$^+$ type polysilicon are arranged. The other configurations and the basic operations, functions and effects of the second embodiment are equivalent to those of the first embodiment. Specifically, the second embodiment facilitates forming the structure capable of obtaining SJ (RESURF (reduced surface field) effect) which exceeds the theoretical performance limits of SiC as in the case of the first embodiment. Moreover, the second embodiment has a heterointerface, and therefore a low-on-resistance switch having good reverse recovery characteristics is realized.

It should be noted that the above-described embodiments are for a purpose of facilitating the understanding of the present invention and are not intended to limit the present invention. Accordingly, each of the components disclosed in the aforementioned embodiments is intended to cover all such design changes and equivalences as fall within the technical scope of the present invention. Although the above-mentioned first and second embodiments have been described by giving the power MOSFET as an example of the switching mechanism, other switching mechanisms may be used, such as a JFET, a MESFET, a bipolar transistor, or a switching element utilizing a heterojunction disclosed in Japanese Patent Laid-open Official Gazette No. 2003-318398. In the above-mentioned first and second embodiments, the hetero-semiconductor region 4 is formed to penetrate to the bottom of the n$^-$ type SiC drain region 1. However, the hetero-semiconductor region 4 does not necessarily reach the bottom of the n$^-$ type SiC drain region 1, or may reach into the n$^+$ type SiC substrate 2.

The entire content of a Patent Application No. TOKUGAN 2004-349485 with a filing date of Dec. 2, 2004 in Japan is hereby incorporated by reference.

Although the invention is not limited to the embodiments described above. Modifications and variations of the embodiments described above will occur to those skilled in the art, in light of the teachings. The scope of the invention is defined with reference to the following claims.

What is claimed is:

1. A semiconductor device, comprising:
   a first conductive type semiconductor base substrate; and
   a switching mechanism which is formed on a first main surface of the semiconductor base substrate and switches ON/OFF of a current,
   wherein a plurality of columnar hetero-semiconductor regions, which are made of a semiconductor material having a different band gap from the semiconductor base substrate, are formed at spaced intervals within the semiconductor base substrate, and the hetero-semiconductor regions extend within the semiconductor base substrate continuously and contact the first main surface and a second main surface opposite to the first main surface.

2. The semiconductor device according to claim 1, wherein the semiconductor base substrate is made of any one of silicon carbide (SiC), gallium nitride (GaN), and diamond, and the hetero-semiconductor regions are made of at least one of single crystal silicon, polycrystalline silicon, and amorphous silicon.

3. The semiconductor device according to claim 1, further comprising:
   a source electrode formed on the first main surface of the semiconductor base substrate; and
   a drain electrode formed on and connected ohmically with the second or the first main surface of the semiconductor base substrate,
   wherein the switching mechanism switches ON/OFF of a current between the drain electrode and the source electrode, and the hetero-semiconductor regions are electrically connected to the source electrode.

4. The semiconductor device according to claim 2, wherein the hetero-semiconductor regions are a second conductive type having a high concentration with respect to the semiconductor base substrate.

* * * * *